United States Patent
Akram et al.

(10) Patent No.: US 9,960,148 B2
(45) Date of Patent: May 1, 2018

(54) METHODS FOR TRANSFERRING HEAT FROM STACKED MICROFEATURE DEVICES

(75) Inventors: Salman Akram, Boise, ID (US); David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 220 days.

(21) Appl. No.: 13/367,158

(22) Filed: Feb. 6, 2012

(65) Prior Publication Data

US 2012/0135567 A1 May 31, 2012

Related U.S. Application Data

(62) Division of application No. 12/557,198, filed on Sep. 10, 2009, now Pat. No. 8,111,515, which is a division of application No. 11/212,986, filed on Aug. 25, 2005, now Pat. No. 7,602,618.

(60) Provisional application No. 60/604,587, filed on Aug. 25, 2004.

(51) Int. Cl.
*H01L 25/065* (2006.01)

(52) U.S. Cl.
CPC .......... *H01L 25/0657* (2013.01); *H01L 2224/05001* (2013.01); *H01L 2224/05009* (2013.01); *H01L 2224/05568* (2013.01); *H01L 2224/16* (2013.01); *H01L 2225/06513* (2013.01); *H01L 2225/06541* (2013.01); *H01L 2225/06589* (2013.01); *H01L 2924/00014* (2013.01)

(58) Field of Classification Search
CPC ....... H01L 25/0657; H01L 2225/06589; H01L 2225/06513; H01L 2225/06541
See application file for complete search history.

(56) References Cited

U.S. PATENT DOCUMENTS 5,128,831 A  7/1992  Fox, III et al.
5,252,857 A  10/1993  Kane et al.
(Continued)

OTHER PUBLICATIONS

Burden, Stephen J., "Isotopically Pure Silicon-28 Delivers High Thermal Conductivity," 8 pages, retrieved from the Internet on May 25, 2004, <http://www.isonics.com/IsoPure.html>.
(Continued)

*Primary Examiner* — Livius R Cazan
(74) *Attorney, Agent, or Firm* — Perkins Coie LLP

(57) ABSTRACT

Methods and apparatuses for transferring heat from stacked microfeature devices are disclosed herein. In one embodiment, a microfeature device assembly comprises a support member having terminals and a first microelectronic die having first external contacts carried by the support member. The first external contacts are operatively coupled to the terminals on the support member. The assembly also includes a second microelectronic die having integrated circuitry and second external contacts electrically coupled to the first external contacts. The first die is between the support member and the second die. The assembly can further include a heat transfer unit between the first die and the second die. The heat transfer unit includes a first heat transfer portion, a second heat transfer portion, and a gap between the first and second heat transfer portions such that the first external contacts and the second external contacts are aligned with the gap.

11 Claims, 7 Drawing Sheets

(56) References Cited

U.S. PATENT DOCUMENTS

| | | | |
|---|---|---|---|
| 5,378,924 A * | 1/1995 | Liang | H01L 23/4334 257/670 |
| 5,518,957 A | 5/1996 | Kim et al. | |
| 5,600,541 A | 2/1997 | Bone et al. | |
| 5,818,107 A * | 10/1998 | Pierson et al. | 257/723 |
| 5,866,953 A | 2/1999 | Akram et al. | |
| 5,883,426 A | 3/1999 | Tokuno et al. | |
| 5,946,553 A | 8/1999 | Wood et al. | |
| 5,986,209 A | 11/1999 | Tandy | |
| 5,989,941 A | 11/1999 | Wensel | |
| 5,990,566 A | 11/1999 | Farnworth et al. | |
| 6,020,624 A | 2/2000 | Wood et al. | |
| 6,020,629 A | 2/2000 | Farnworth et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,049,125 A | 4/2000 | Brooks et al. | |
| 6,051,878 A | 4/2000 | Akram et al. | |
| 6,072,233 A | 6/2000 | Corisis et al. | |
| 6,072,236 A | 6/2000 | Akram et al. | |
| 6,075,288 A | 6/2000 | Akram | |
| 6,122,171 A | 9/2000 | Akram et al. | |
| 6,148,509 A | 11/2000 | Schoenfeld et al. | |
| 6,153,924 A | 11/2000 | Kinsman | |
| 6,159,764 A | 12/2000 | Kinsman et al. | |
| 6,163,956 A | 12/2000 | Corisis | |
| 6,175,149 B1 | 1/2001 | Akram | |
| 6,208,519 B1 | 3/2001 | Jiang et al. | |
| 6,212,767 B1 | 4/2001 | Tandy | |
| 6,215,175 B1 | 4/2001 | Kinsman | |
| 6,225,689 B1 | 5/2001 | Moden et al. | |
| 6,235,554 B1 | 5/2001 | Akram et al. | |
| 6,252,308 B1 | 6/2001 | Akram et al. | |
| 6,252,772 B1 | 6/2001 | Allen | |
| 6,258,623 B1 | 7/2001 | Moden et al. | |
| 6,281,577 B1 | 8/2001 | Oppermann et al. | |
| 6,294,839 B1 | 9/2001 | Mess et al. | |
| 6,297,547 B1 | 10/2001 | Akram | |
| 6,297,548 B1 | 10/2001 | Moden et al. | |
| 6,303,981 B1 | 10/2001 | Moden | |
| 6,314,639 B1 | 11/2001 | Corisis | |
| 6,326,242 B1 | 12/2001 | Brooks et al. | |
| 6,326,687 B1 | 12/2001 | Corisis | |
| 6,332,766 B1 | 12/2001 | Thummel | |
| 6,344,976 B1 | 2/2002 | Schoenfeld et al. | |
| 6,426,642 B1 | 7/2002 | Akram et al. | |
| 6,429,528 B1 | 8/2002 | King et al. | |
| 6,437,433 B1 * | 8/2002 | Ross | H01L 25/0657 257/692 |
| 6,451,709 B1 | 9/2002 | Hembree | |
| 6,538,892 B2 | 3/2003 | Smalc | |
| 6,548,376 B2 | 4/2003 | Jiang | |
| 6,552,910 B1 | 4/2003 | Moon et al. | |
| 6,559,525 B2 | 5/2003 | Huang | |
| 6,560,117 B2 | 5/2003 | Moon et al. | |
| 6,563,712 B2 | 5/2003 | Akram et al. | |
| 6,573,461 B2 | 6/2003 | Roeters et al. | |
| 6,577,013 B1 * | 6/2003 | Glenn et al. | 257/777 |
| 6,607,937 B1 | 8/2003 | Corisis | |
| 6,614,092 B2 | 9/2003 | Eldridge et al. | |
| 6,710,442 B1 | 3/2004 | Lindgren et al. | |
| 6,717,251 B2 | 4/2004 | Matsuo et al. | |
| 6,737,581 B2 * | 5/2004 | Hogerl | 174/541 |
| 7,115,442 B2 | 10/2006 | Baik et al. | |
| 7,115,961 B2 | 10/2006 | Watkins et al. | |
| 8,111,515 B2 | 2/2012 | Akram et al. | |
| 2001/0045644 A1 | 11/2001 | Huang | |
| 2002/0000829 A1 | 1/2002 | Akram et al. | |
| 2002/0036338 A1 | 3/2002 | Matsuo et al. | |
| 2002/0079567 A1 | 6/2002 | Lo et al. | |
| 2002/0149095 A1 * | 10/2002 | Eldridge | 257/678 |
| 2002/0155692 A1 * | 10/2002 | Kong | H01L 25/0657 438/613 |
| 2003/0013275 A1 * | 1/2003 | Burden | C30B 23/02 438/458 |
| 2003/0146012 A1 | 8/2003 | Song et al. | |
| 2003/0205801 A1 | 11/2003 | Baik et al. | |
| 2004/0000708 A1 | 1/2004 | Rapport et al. | |
| 2004/0201086 A1 | 10/2004 | Joshi | |
| 2005/0046000 A1 | 3/2005 | Seng et al. | |
| 2005/0101056 A1 | 5/2005 | Song et al. | |
| 2005/0121758 A1 | 6/2005 | Di Stefano | |
| 2006/0044773 A1 | 3/2006 | Akram et al. | |
| 2006/0102997 A1 | 5/2006 | Bang et al. | |

OTHER PUBLICATIONS

Daisho Denshi, Printed Circuit Board, 5 pages, retrieved from the Internet on Mar. 22, 2006, <http://www.daisho-denshi.co.jp/en/Products_Page/printed_circuit_board.htm>.

* cited by examiner

METHODS FOR TRANSFERRING HEAT FROM STACKED MICROFEATURE DEVICES

CROSS-REFERENCE TO RELATED APPLICATIONS

This application is a divisional of U.S. patent application Ser. No. 12/557,198 filed Sep. 10, 2009, now U.S. Pat. No. 8,111,515, which is a divisional of U.S. patent application Ser. No. 11/212,986 filed Aug. 25, 2005, now U.S. Pat. No. 7,602,618, which claims the benefit of U.S. Provisional Patent Application No. 60/604,587 filed Aug. 25, 2004, each of which is incorporated herein by reference in its entirety.

TECHNICAL FIELD

The present invention relates generally to methods and apparatuses for transferring heat from stacked microfeature devices.

BACKGROUND

The current trend in microfeature device fabrication is to manufacture smaller and faster microfeature devices with a higher density of components for computers, cell phones, pagers, personal digital assistants, and many other products. All microfeature devices generate heat, and dissipating such heat is necessary for optimum and reliable operation of high-performance devices. Moreover, as the speed and component density increases, the heat becomes a limiting factor in many products. For example, high performance devices that generate from 80-100 watts may not operate at rated levels or may degrade unless some of the heat is dissipated. Accordingly, heat dissipation is a significant design factor for manufacturing microfeature devices.

Stacked microfeature devices are particularly susceptible to overheating. Memory devices, for example, often have one or more dies stacked on each other to increase the density of memory within a given footprint. In stacked memory devices, each die is generally very thin to reduce the profile (i.e., height) of the device. The dies may also be thin to construct through-wafer interconnects through the dies. For example, it is much easier and more reliable to etch the vias for through-wafer interconnects when the wafer is 150 μm thick instead of the customary 750 μm thickness. However, one concern of using 150 μm thick dies in stacked assemblies is that the thinner dies have less surface area per unit volume than thicker dies. This reduces the heat transfer rate of the thinner dies such that thinner dies dissipate less heat than thicker dies. Therefore, it would be desirable to increase the heat transfer rate from very thin dies that are highly useful for constructing through-wafer interconnects and stacking on each other in low-profile stacked devices.

DETAILED DESCRIPTION

A. Overview/Summary

Figure 1A:
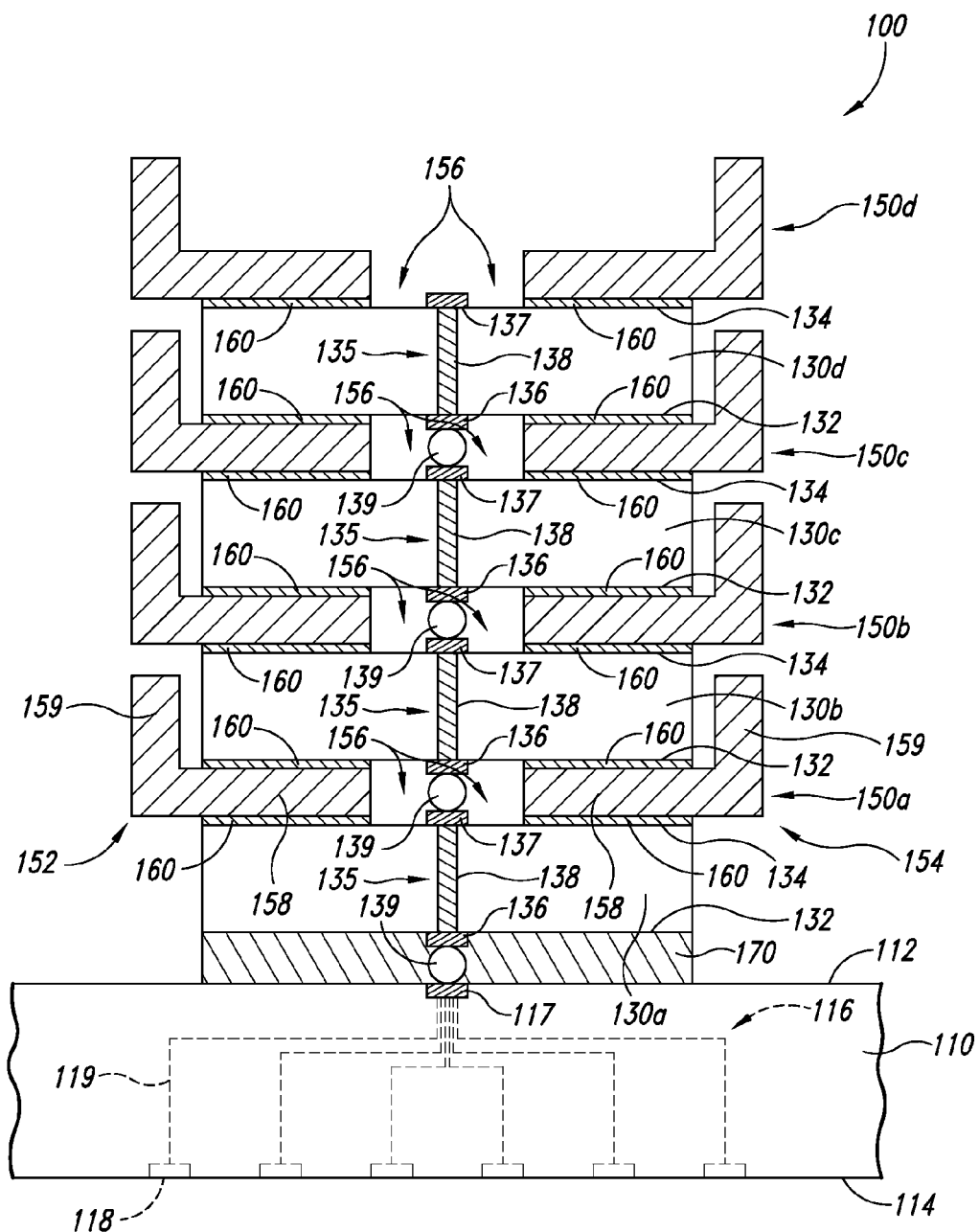
FIG. 1A is a side cross-sectional view of a microfeature device assembly having a plurality of heat transfer units in accordance with an embodiment of the invention.

The present invention is directed to methods and apparatuses for transferring heat from stacked microfeature devices. The term "microfeature device" is used throughout to include a device formed from a substrate upon which and/or in which submicron circuits or components and/or data storage elements or layers are fabricated. Submicron features in the substrate include, but are not limited to, trenches, vias, lines, and holes. These features typically have a submicron width generally transverse to a major surface of the device (e.g., a front side or a backside). Many microfeature devices have features with submicron widths of less than 0.1 μm to over 0.75 μm. The term microfeature device is also used to include substrates upon which and/or in which micromechanical features are formed. Such features include read/write heads and other micromechanical features having submicron or supramicron dimensions. In many of these embodiments, the substrate is formed from suitable materials, including ceramics, and may support layers and/or other formations of other materials including, but not limited to, metals, dielectric materials, and polymers.

A microfeature device assembly in accordance with one embodiment of the invention can include a support member having terminals. The assembly can also include a first microelectronic die having integrated circuitry and first external contacts carried by the support member. The first external contacts of the first die are operatively coupled to the terminals on the support member. The first external contacts, for example, can have first contact pads, second contact pads, and interconnects electrically connecting first contact pads to corresponding second contact pads. The assembly can further include a second microelectronic die having integrated circuitry and second external contacts electrically coupled to the first external contacts of the first die. The first die is between the support member and the second die. The assembly can also include a heat transfer unit between the first die and the second die. The heat transfer unit includes a first portion, a second portion, and a gap between the first and second portions such that the first external contacts of the first die and the second external contacts of the second die are aligned with the gap.

A method in accordance with another aspect of the invention includes positioning a first microelectronic die on a support member having terminals. The first die includes first external contacts electrically coupled to the terminals. The method continues by securing a heat transfer unit to the first die. The heat transfer unit has a first portion, a second portion, and a gap between the first and second portions. The method further includes attaching a second microelectronic die having second external contacts to the heat transfer unit such that the first die is between the support member and the second die. Additionally, the first external contacts at a backside of the first die are aligned with the gap and in electrical contact with the second external contacts at a front side of the second die.

The present disclosure describes microfeature devices and methods for transferring heat from stacked microfeature devices. Many specific details of certain embodiments of the invention are set forth in the following description and in FIGS. 1A-4 to provide a thorough understanding of these embodiments. One skilled in the art, however, will understand that the present invention may have additional embodiments, or that the invention can be practiced without several of the details described below.

B. Embodiments of Methods and Apparatuses for Transferring Heat from Stacked Microfeature Devices FIG. 1A is a side cross-sectional view of a microfeature device assembly 100 in accordance with one embodiment of the invention. The assembly 100 includes a support member 110, microelectronic dies 130 stacked on the support member 110, and heat transfer units 150 between the individual dies 130 to transfer heat from the stacked dies and thereby cool the assembly 100. The heat transfer units 150 can be made from a material having a high thermal conductivity to rapidly dissipate heat from the dies 130. The dies 130, therefore, can be ultra-thin dies that are suitable for producing through-wafer interconnects and low-profile devices.

In the illustrated embodiment, the support member 110 includes a front side 112, a backside 114, and support member circuitry 116. The support member 110 can include, for example, an interposer substrate that provides an array of contact pads for coupling very small contacts on the microelectronic dies 130 to another type of device. More particularly, the support member circuitry 116 provides an array of terminals 117 (e.g., bond-pads) at the front side 112 of the support member 110, ball-pads 118 at the backside 114 of the support member 110, and conductive traces 119 electrically connecting individual terminals 117 to corresponding ball-pads 118. The support member circuitry 116 redistributes the fine pitch array of very small contacts on the microelectronic dies 130 to the backside 114 of the support member 110 to electrically couple the dies 130 to external components.

The assembly 100 further includes several microelectronic dies 130 (identified individually as first die 130a, second side 130b, third die 130c, and fourth die 130d) stacked on the support member 110. Although four dies 130a-d are shown in the illustrated embodiment, in other embodiments the assembly 100 may include a different number of dies and/or one or more of the dies 130a-d be different than the other dies, as described below with respect to FIG. 2C. The individual dies 130a-d each include a front side 132, a backside 134, integrated circuitry (not shown), and external contacts 135 electrically coupled to the integrated circuitry. The external contacts 135 shown in FIG. 1A each include a small array of contact pads within the footprint of each die 130a-d. The individual external contacts 135, for example, can include a first contact pad 136 (e.g., a front side wire bond-pad), a second contact pad 137 (e.g., a backside ball-pad), and an interconnect 138 electrically coupling the first contact pad 136 to the second contact pad 137. In the illustrated embodiment, the first contact pads 136 are on the front side 132 of each die 130a-d and the second contact pads 137 are on the backside 134 of each die 130a-d. The embodiment of the interconnects 138 shown in FIG. 1A are through-wafer interconnects that extend completely through the dies 130 to couple individual first contact pads 136 to corresponding second contact pads 137. In other embodiments, however, the first contact pads 136 may be at an intermediate depth within the dies 130 and the interconnects 138 may not extend completely through the dies 130. In another aspect of this embodiment, connectors 139 are attached to respective first and second contact pads 136 and 137 to electrically couple the dies 130 to the terminals 117.

In the assembly 100, the dies 130 are stacked and electrically coupled to each other. For example, the second die 130b is stacked on the first die 130a such that individual connectors 139 electrically couple individual first contact pads 136 at the front side 132 of the second die 130b to corresponding second contact pads 137 at the backside 134 of the first die 130a. The first contact pads 136 at the front side 132 of the first die 130a are electrically coupled to corresponding terminals 117 with the connectors 139. The third die 130c is stacked and electrically coupled to the second microelectronic die 130b in similar fashion, and the fourth die 130d is coupled to the third die 130c in a similar fashion.

Figure 1B:
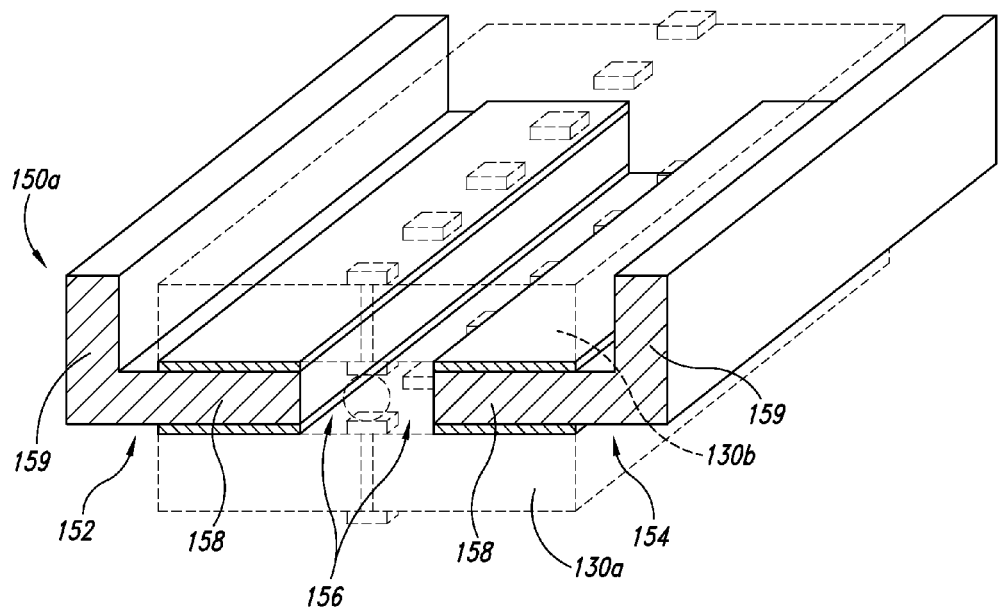
FIG. 1B is an isometric view of an individual heat transfer unit from the assembly illustrated in FIG. 1A.

The stacked dies 130 in the assembly 100 are cooled by the plurality of heat transfer units 150 (identified individually as 150a-150d) between the individual dies 130. FIG. 1B is an isometric view of the first heat transfer unit 150a from the assembly 100 illustrated in FIG. 1A. Although only the first heat transfer unit 150a is shown in FIG. 1B and discussed below, the configuration of the other heat transfer units 150b-d can be substantially the same in many embodiments of the assembly 100. Referring to FIGS. 1A and 1B together, the heat transfer unit 150a includes a first portion 152 and a second portion 154. The first portion 152 is separated from the second portion 154 by an elongated gap 156 extending lengthwise along a medial portion of the heat transfer unit 150a. The first and second portions 152 and 154 each include a first region 158 (e.g., a base) and a second region 159 (e.g., a fin). The bases 158 are generally planar, and the fins 159 extend generally normal to the bases 158. In other embodiments, the fins 159 may project at a different angle from the bases 158. The first and second portions 152 and 154 of the heat transfer unit 150a are molded as single pieces with no readily separable mechanical connections between their respective component parts (i.e., the base 158 and the fin 159 are integrally connected). In alternative embodiments, however, the first and second portions 152 and 154 may each include a base and a fin that are separate components adhered together, or the first and second portions may be connected together such that the gap is a slot in which the terminals and contact pads can be positioned.

Figure 1C:
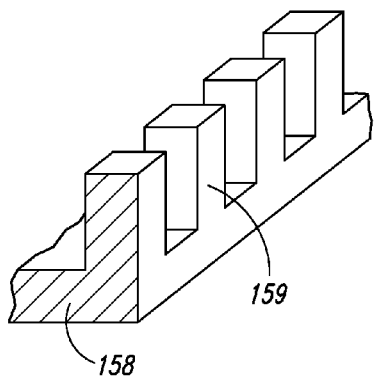
FIGS. 1C and 1D are isometric views of heat transfer units in accordance with other embodiments of the invention.
Figure 1D:
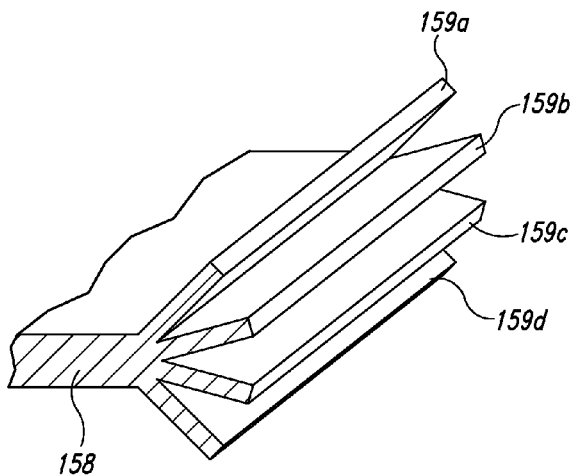

FIGS. 1C and 1D are isometric views illustrating alternative embodiments of the fins 159 shown in FIG. 1B. In FIG. 1C, for example, the fins 159 have slots or gaps to increase the surface area and airflow for dissipating heat. The embodiment shown in FIG. 1D has a plurality of fins 159a-d fanning out from the edge of the base 158. The fins 159 can accordingly have many different configurations for increasing the surface area and/or promoting airflow to enhance the heat transfer rate of the heat transfer units.

The heat transfer units 150a-d are thermally conductive interlayers composed of a material having a high thermal conductivity. The heat transfer units 150 are preferably composed of a material having a higher thermal conductivity than the silicon of the dies 130. In one embodiment, the heat transfer units 150 are composed of Silicon-28 (Si-28), which has a thermal conductivity of up to 600% greater than typical silicon. Si-28 is commercially available from the Isonics Corporation of Golden, Colo. In other embodiments, the heat transfer units 150a-d may be formed from Si, Cu, Al, and/or other highly thermally conductive metallic or non-metallic materials.

In the embodiment illustrated in FIGS. 1A and 1B, the individual heat transfer units 150a-d can be attached to corresponding dies 130a-d with a dielectric adhesive 160 between the heat transfer units 150a-d and the dies 130a-d. More particularly, the adhesive 160 can electrically isolate the heat transfer units 150a-d from the dies 130a-d and/or connectors 139. The gaps 156 through the heat transfer units 150a-d can also be filled with the adhesive 160. In other embodiments, the heat transfer units 150a-d may be secured to the dies 130a-d with a thermally conductive, dielectric paste without adhesive characteristics if the connectors 139 sufficiently secure the dies 130a-d to each other.

In another aspect of this embodiment, the first die 130a can be attached to the support member 110 with a layer of underfill material 170. The underfill material 170 is typically a thermoplastic material or a resin (natural or synthetic) that can be applied between the die 130a and the support member 110. The underfill material 170 compensates for the stresses induced between the first die 130a and the support member 110 caused by the different coefficients of thermal expansion (CTE) of the die 130a and the support member 110. The placement and configuration of the underfill material 170, however, may depend on the arrangement of the terminals 117 at the front side 112 of the support member 110. In other embodiments, the first die 130a can be attached directly to the support member 110 without an underfill 170, or a heat transfer unit can be positioned between the die 130a and the support member 110 as described below.

One advantage of the assembly 100 is that the heat transfer units 150 significantly increase the heat transfer rate from the dies 130 to dissipate more heat from the assembly 100 compared to devices without heat transfer units 150. Because the heat transfer units 150 more effectively cool the dies 130, the dies 130 can be very thin. In many embodiments, the dies 130 are approximately 100 µm to 250 µm thick, and more specifically, the dies can be approximately 150 µm thick. As such, the dies 130 can be well suited for forming the interconnects 138 because it is much easier to etch the vias for the interconnects 138 through 100 µm-250 µm of silicon than through 750 µm of silicon.

Another advantage of the combination of the dies 130 and the heat transfer units 150 is that using ultra-thin dies and thin heat transfer units can reduce the profile of the assembly 100. In many embodiments, for example, the heat transfer units 150 can be approximately 50 µm to 500 µm thick. Therefore, the combined thickness of a die 130 and a heat transfer unit 150 can be much less than the thickness of a silicon die having the same heat transfer properties because the heat transfer units 150 can have a significantly higher thermal conductivity than the dies 130. This allows the device assembly 100 to have a low profile.

Another advantage of the embodiment of the device 100 shown in FIG. 1A is that the fins 159 further enhance the heat transfer rate without increasing the height of the assembly 100. For example, the fins 159 of the first heat transfer unit 150a can be installed in close proximity to the fins 159 of the second heat transfer unit 150b without interfering with the adjoining fins. Furthermore, the fins 159 of one heat transfer unit may contact the fins of an adjoining heat transfer unit. A larger number of dies 130 can accordingly be stacked together in the assembly 100 while also transferring heat away from the assembly 100 at a relatively high rate.

Figure 2A:
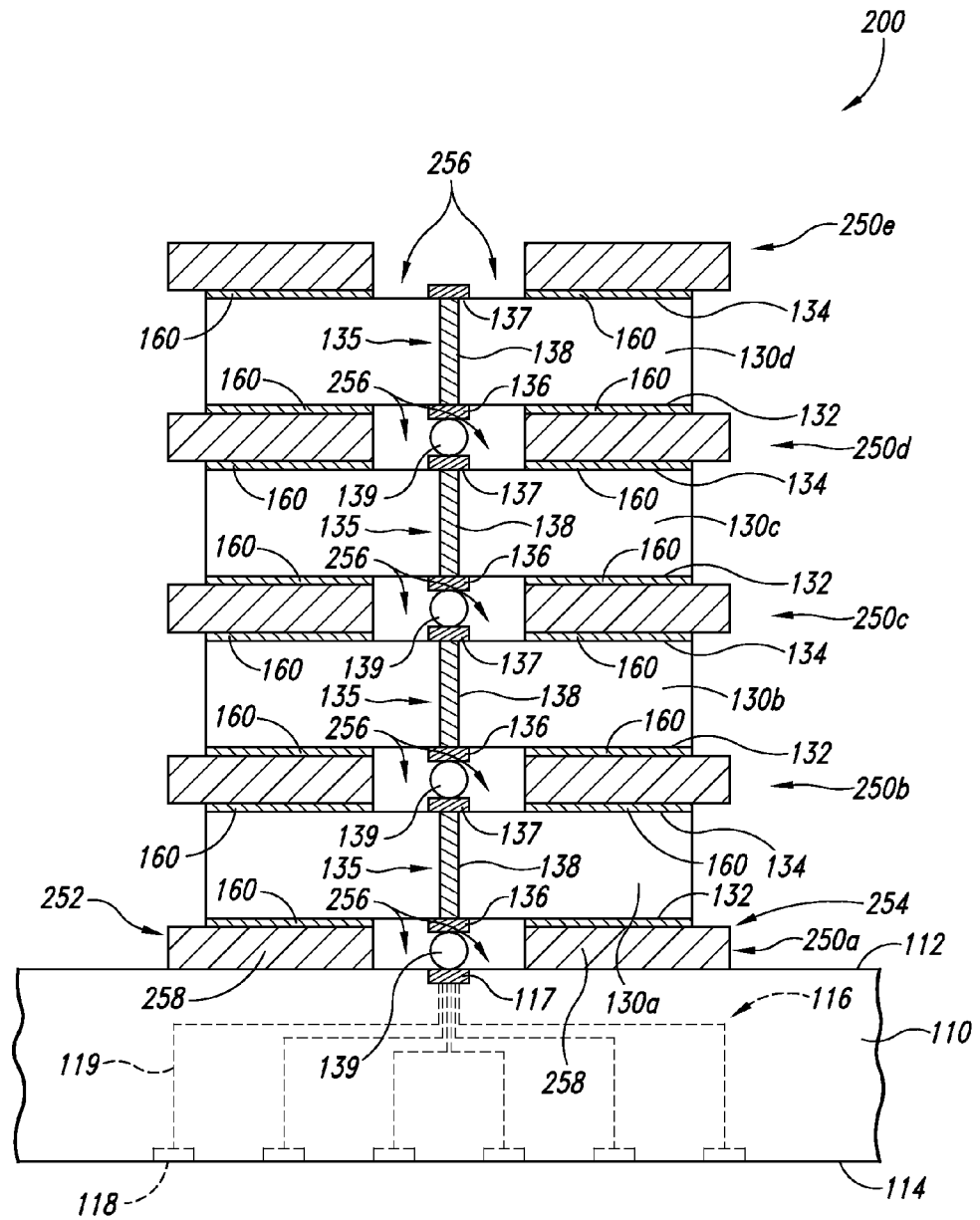
FIG. 2A is a side cross-sectional view of a microfeature device assembly having a plurality of heat transfer units in accordance with another embodiment of the invention.

FIG. 2A is a side cross-sectional view of a microfeature device assembly 200 in accordance with another embodiment of the invention. The assembly 200 includes the support member 110 and the dies 130 described above with respect to FIG. 1A. The assembly 200 further includes heat transfer units 250 between the individual dies 130 to transfer heat from the dies 130 and thereby cool the assembly 100. The assembly 200 differs from the assembly 100 of FIG. 1A in that the heat transfer units 250 have a different configuration than the heat transfer units 150. The heat transfer units 250 (identified individually as heat transfer units 250a-e) in the illustrated embodiment include a first portion 252 and a second portion 254. In the illustrated embodiment, the first and second portions 252 and 254 of the individual heat transfer units 250a-e extend beyond a perimeter of the corresponding dies 130a-d. In other embodiments, however, the first and second portions 252 and 254 of the heat transfer units 250a-e can be flush with the perimeter of the dies 130a-d.

The first portions 252 of the individual heat transfer units 250 are separated from the second portions 254 by an elongated gap 256 extending lengthwise along a medial portion of the heat transfer units 250. The gaps 256 through the heat transfer units 250a-c can be filled with an underfill material (not shown). The underfill material can be generally similar to the underfill material 170 described above with respect to FIG. 1A. The first and second portions 252 and 254 of the heat transfer units 250 each include a first region 258 (e.g., a base). The heat transfer units 250a-e in the embodiment shown in FIG. 2 do not include fins. One advantage of this arrangement is that the heat transfer units 250a-e can be installed in close proximity to each other without the fins of one heat transfer unit interfering with the fins of its neighbor.

In another aspect of this embodiment, the first die 130a is separated from the support member 110 by a first heat transfer unit 250a, as opposed to the underfill material 170 of the assembly 100 illustrated in FIG. 1A. One advantage of this feature is that the additional heat transfer unit 250a further increases the rate at which heat is transferred away from the assembly 200.

Figure 2B:
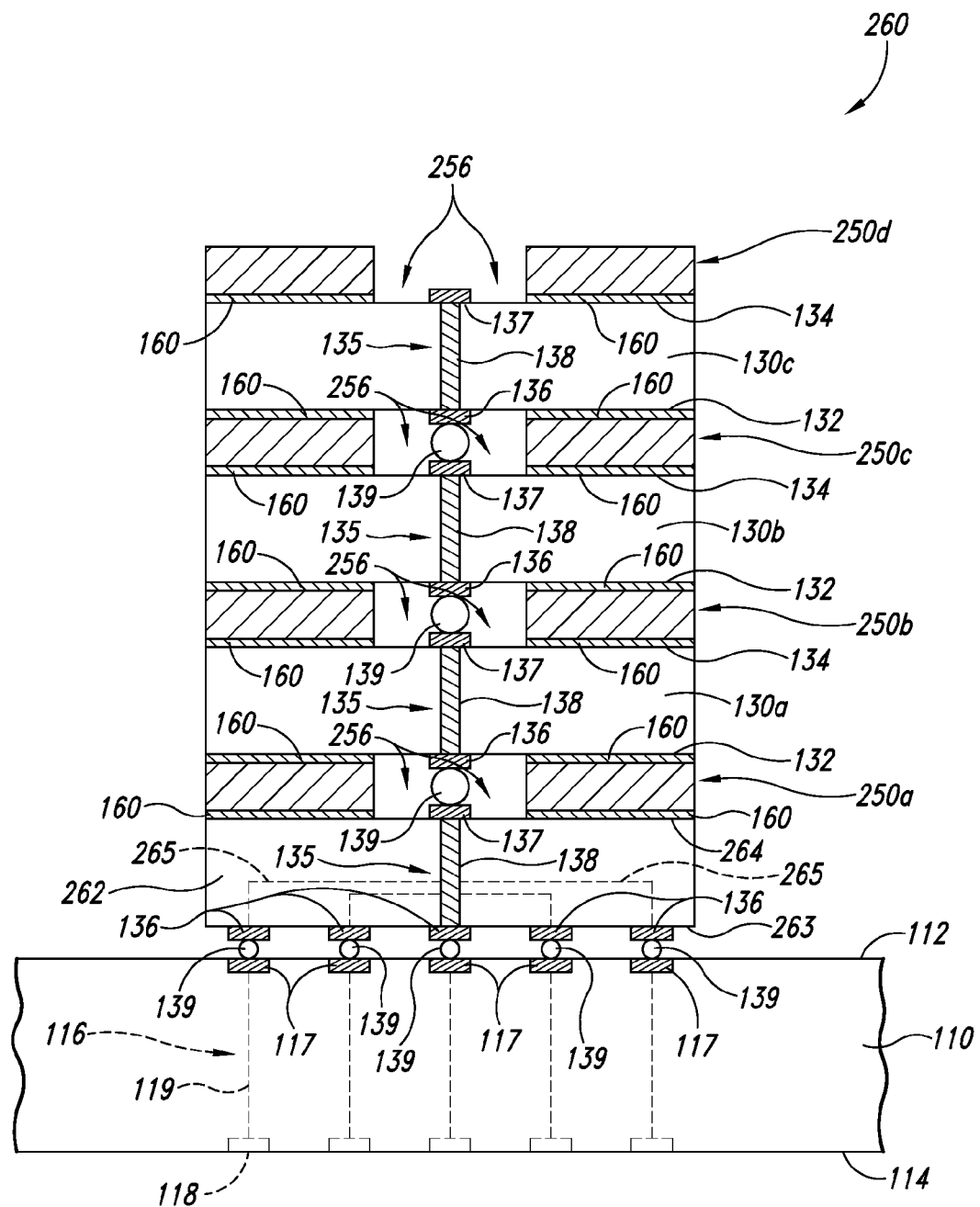
FIG. 2B is a side cross-sectional view of a microfeature device assembly having a plurality of heat transfer units in accordance with still another embodiment of the invention.

FIG. 2B is a side cross-sectional view of a microfeature device assembly 260 in accordance with still another embodiment of the invention. The assembly 260 differs from the assembly 200 of FIG. 2A in that the dies do not all have the same configuration. The assembly 260, for example, includes a first die 262 coupled to the support member 110 in a flip-chip configuration. More particularly, the die 262 includes a front side 263, a back side 264, integrated circuitry (not shown), and external contacts 135 electrically coupled to the integrated circuitry. The embodiment of the external contacts 135 shown in FIG. 2B includes an array of first contact pads 136 on the front side 263 of the die and electrically coupled to corresponding terminals 117 on the front side 112 of the support member 110. The die 262 further includes internal circuitry 265 electrically coupling the first contact pads 136 to the interconnect 138.

In another aspect of this embodiment, the first and second portions 252 and 254 of the heat transfer units 250a-d are flush with the perimeter of the dies 130a-d and 262, rather than extending outwardly past the perimeter of the dies. One advantage of this feature is that it can further reduce the footprint of the assembly 260.

Figure 2C:
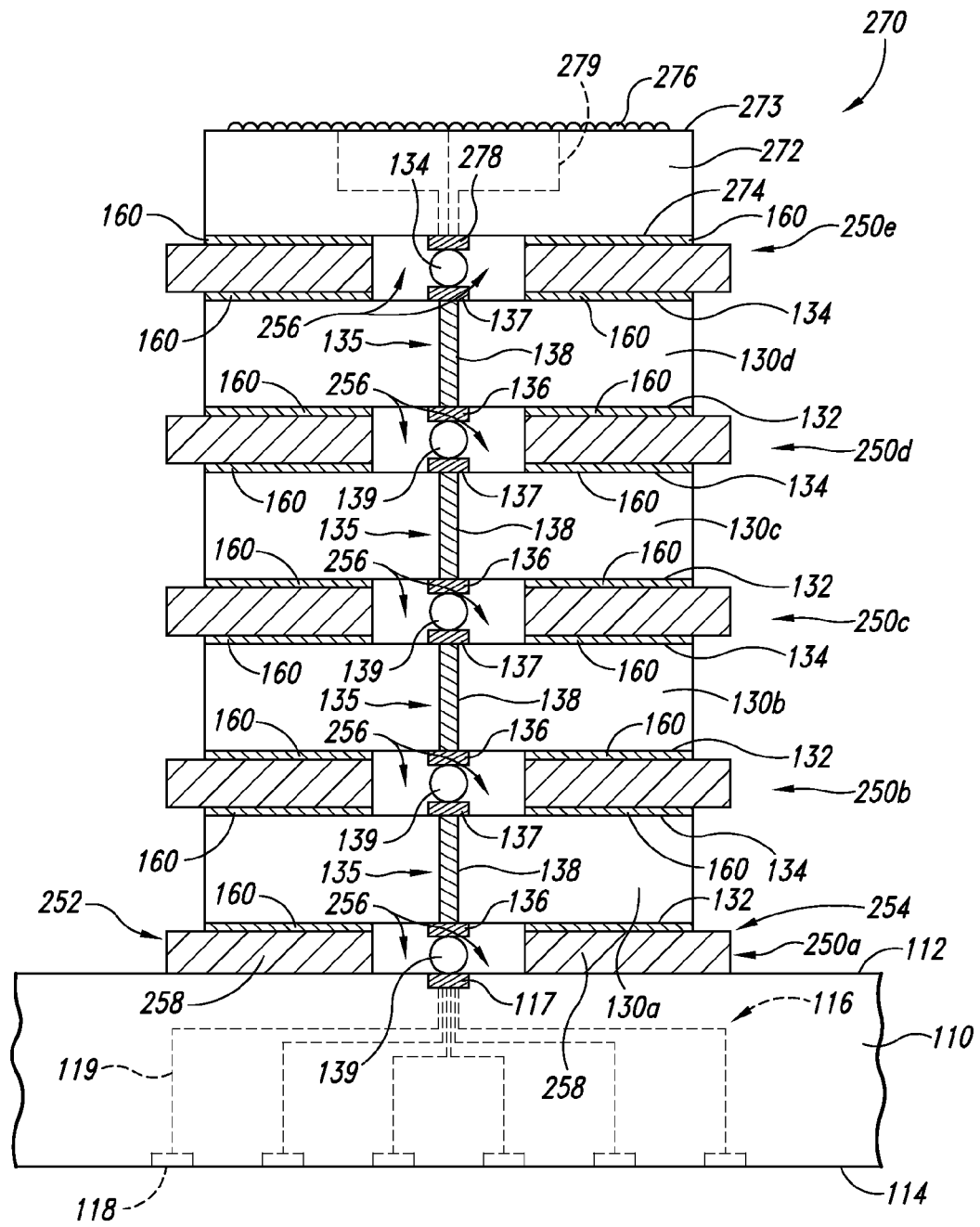
FIG. 2C is a side cross-sectional view of a microfeature device assembly having a plurality of heat transfer units in accordance with yet another embodiment of the invention.

FIG. 2C is a side cross-sectional view of a microfeature device assembly 270 in accordance with yet another embodiment of the invention. The assembly 270 includes a support member 110 and the dies 130 described above with respect to FIG. 1A and the heat transfer units 250 described above with respect to FIG. 2A. The assembly 270 differs from the assemblies 100, 200, and 260 described above with respect to FIGS. 1A, 2A, and 2B, respectively, in that the assembly 270 further includes an imaging die 272 stacked on top of the other dies 130. The imaging die 272 includes a front side 273, a back side 274, integrated circuitry (not shown), and an image sensor 276 at the front side 273 of the die and electrically coupled to the integrated circuitry. The imaging die 272 further includes a contact pad 278 at the back side 274 electrically coupled to the image sensor 276 via conductive lines 279. In this way, signals from the image sensor 276 can be distributed to the ball-pads 118 at the back side 114 of the support member 110. One advantage of this arrangement is that the assembly 270 can include different types of dies (e.g., an imaging die and a DRAM memory device) configured to perform different functions.

Figure 3:
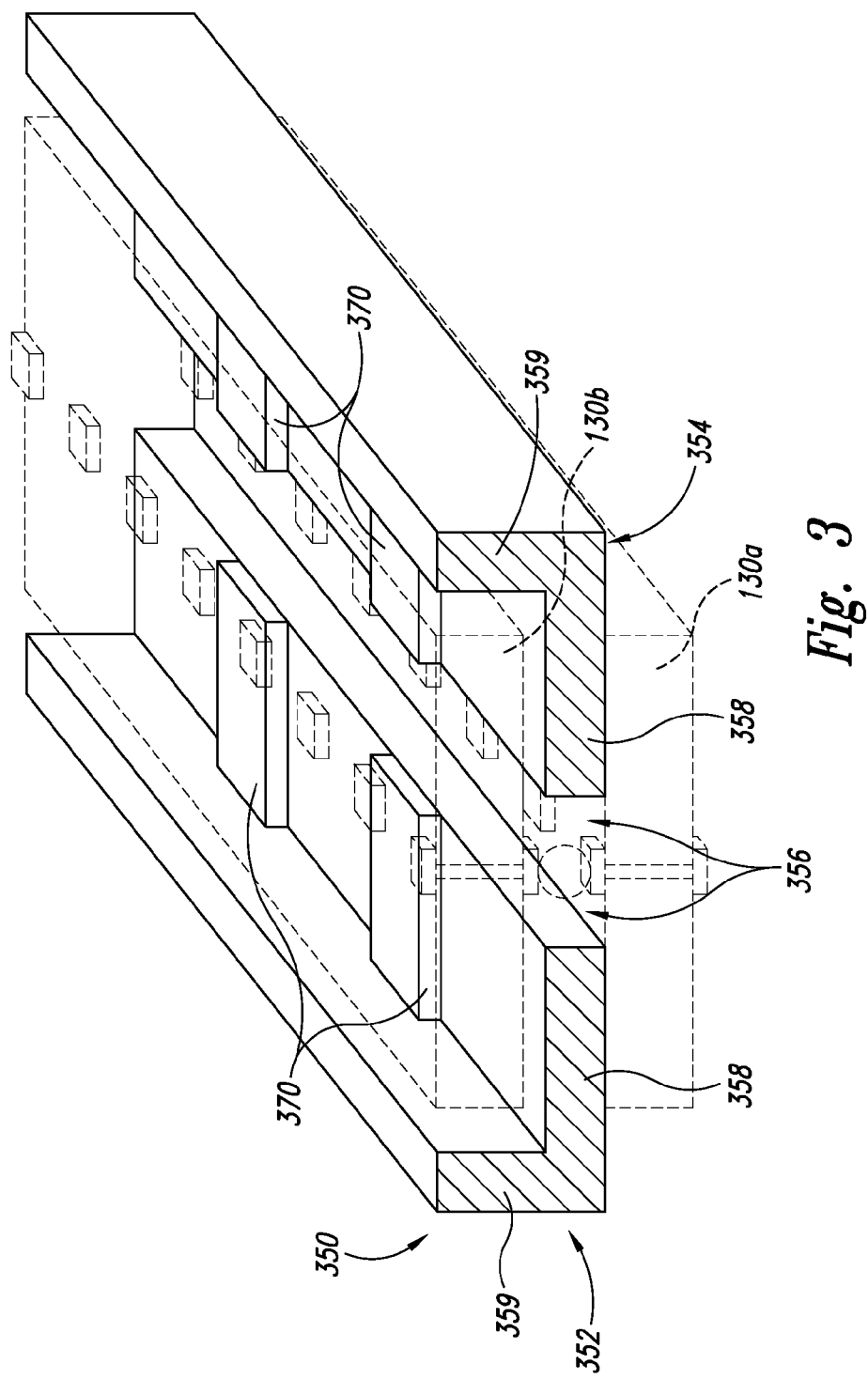
FIG. 3 is an isometric view of a heat transfer unit in accordance with another embodiment of the invention.
Figure 4:
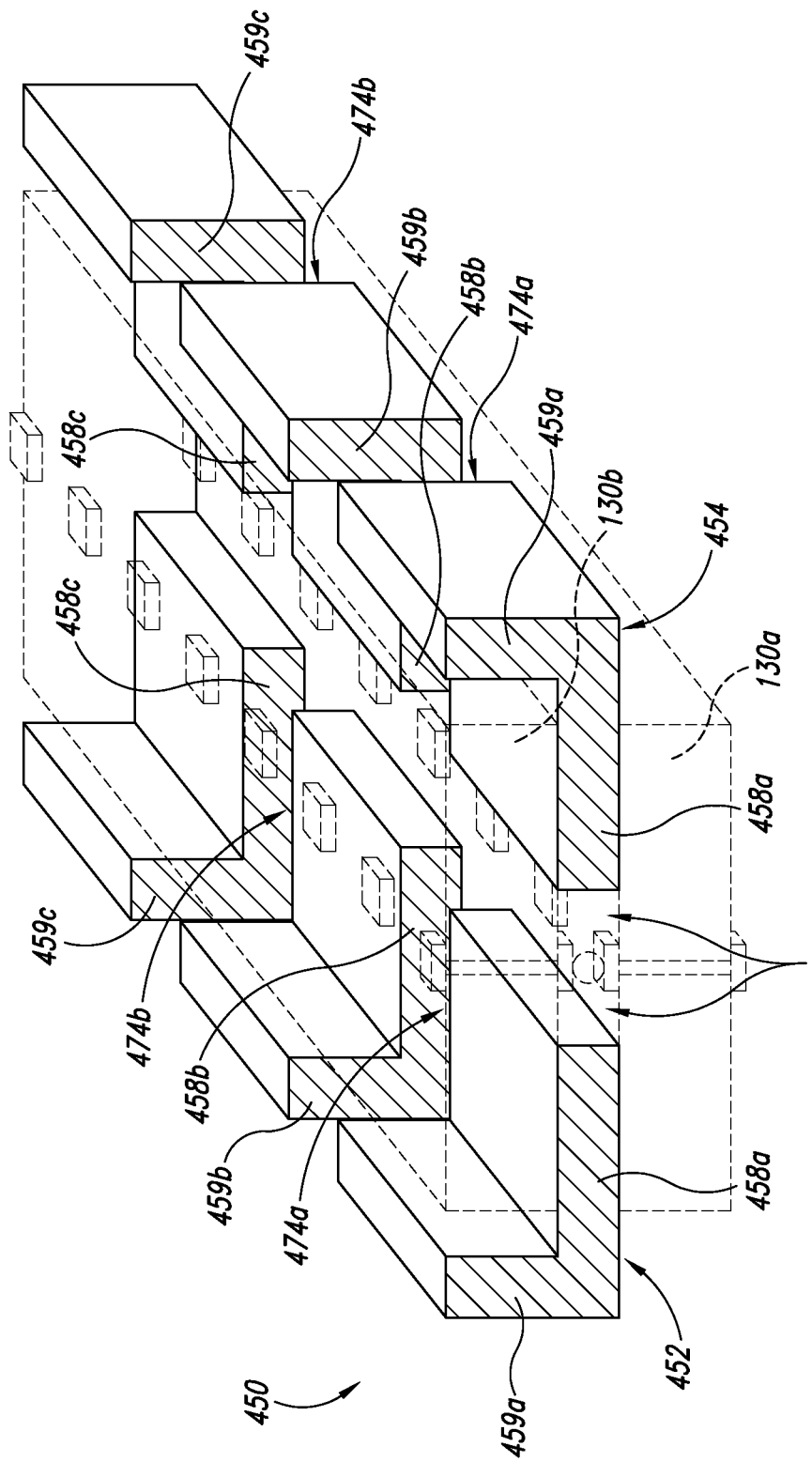
FIG. 4 is an isometric view of a heat transfer unit in accordance with yet another embodiment of the invention.

C. Additional Embodiments of Heat Transfer Units for Transferring Heat from Stacked Microfeature Devices FIGS. 3 and 4 illustrate two alternative embodiments of heat transfer units for use with the assembly 100 or the assembly 200 described above with reference to FIGS. 1A and 2, respectively. In each of FIGS. 3 and 4, several of the features may be the same as those discussed above in connection with the assembly 100 of FIG. 1A or the assembly 200 of FIG. 2. Accordingly, like reference numbers refer to like components in FIG. 1A and FIGS. 3 and 4.

FIG. 3 is an isometric view of a heat transfer unit 350 in accordance with another embodiment of the invention. The heat transfer unit 350 can be used in the assembly 100 or the assembly 200 described above. The heat transfer unit 350 includes a first portion 352 and a second portion 354. The first and second portions 352 and 354 are separated by an elongated gap 356 extending lengthwise along a medial portion of the heat transfer unit 350. The first and second portions 352 and 354 each include a first region 358 (e.g., a base) and a second region 359 (e.g., a fin) integrally connected with the first region 358. The heat transfer unit 350 further includes a plurality of non-planar features 370 on the base 358. The non-planar features 370 generally include a protrusion and/or ridge on a top surface of the base 358. The non-planar features 370 increase the surface area of the heat transfer unit 350, thus enhancing the rate at which heat is removed from the attached dies 130a-b (shown in broken lines).

FIG. 4 is an isometric view of a heat transfer unit 450 in accordance with yet another embodiment of the invention. The heat transfer unit 450 can be used in the assembly 100 or the assembly 200 described above. The heat transfer unit 450 includes a first portion 452 and a second portion 454 separated by an elongated gap 456 extending lengthwise along a medial portion of the heat transfer unit 450. The heat transfer unit 450 differs from the heat transfer units 150/250/350 described above in that the individual first and second portions 452 and 454 each include a plurality of bases 458 and fins 459. For example, the first and second portions 452 and 454 each include bases 458a-c separated by openings 474a and 474b and fins 459a-c integrally connected with the corresponding bases 458a-c. Although the first and second portions 452 and 454 in the illustrated embodiment each include three bases 458a-c, in other embodiments the first and second portions 452 and 454 may have a different number of bases 458.

The first and second portions 452 and 454 of the heat transfer unit 450 can be formed by applying a flex tape to the backside 134 of corresponding dies 130. In the illustrated embodiment, for example, the first and second portions 452 and 454 of the heat transfer unit 450 are formed by placing flex tape on the backside 134 of the die 130a (shown in broken lines). The flex tape has a flexible dielectric carrier and conductive features in a desired pattern on the carrier. For example, the flex tape can have a Kapton carrier with copper traces and/or pads on one or both surfaces of the carrier. In other embodiments, the first and second portions 452 and 454 may be formed on the dies 130 using a pattern etch or other methods known to those in the art.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Accordingly, the invention is not limited except as by the appended claims.

We claim:

1. A method for assembling a microfeature device assembly, comprising:
   positioning a first microelectronic die on a front side of an interposer substrate having terminals, the first die having a first planform shape and including first external contacts electrically coupled to the terminals;
   attaching a heat transfer unit to the first die, the heat transfer unit having a first portion and a second portion in contact with the first die, wherein the second portion is out of mechanical contact with and spaced apart from the first portion by a gap extending between the first and second portions; and
   stacking and securing a second microelectronic die having second external contacts to the heat transfer unit such that the first die is between the interposer substrate and the second die, wherein the second microelectronic die has a second planform shape the same as the first planform shape when viewed in the stacking direction, wherein the first external contacts of the first die and the second external contacts of the second die are aligned with the gap and in electrical contact, and wherein the heat transfer unit has a thickness equal to or greater than a thickness of the first die and a thickness of the second die.

2. The method of claim 1, further comprising applying an underfill to the front side of the interposer substrate before positioning the first die on the front side of the interposer substrate.

3. The method of claim 1 wherein the heat transfer unit is a first heat transfer unit and the gap is a first gap, and wherein the method further comprises:
   attaching a second heat transfer unit to the front side of the interposer substrate between the first die and the interposer substrate, the second heat transfer unit having a third portion, a fourth portion, and a second gap between the third and fourth portions;
   securing the first die to the second heat transfer unit such that the first external contacts of the first die are aligned with the second gap.

4. The method of claim 1 wherein:
   the first portion comprises a first base and a first fin integrally connected with the first base, the second portion comprises a second base and a second fin integrally connected with the second base, and wherein the first and second bases are generally planar and the first and second fins extend generally normal to the first and second bases, respectively; and securing a heat transfer unit to the first die comprises attaching the first and second portions to a back side of the first die.

5. The method of claim 1 wherein:

securing the heat transfer unit to the first die comprises using an adhesive to secure the heat transfer unit to the first die; and securing the second die to the heat transfer unit comprises using an adhesive to secure the heat transfer unit to the second die.

6. The method of claim 1 wherein the heat transfer unit is a first heat transfer unit and the gap is a first gap, and wherein the method further comprises:

attaching a second heat transfer unit to a back side of the second die, the second heat transfer unit having a third portion, a fourth portion, and a second gap between the third and fourth portions; and securing a third microelectronic die having third external contacts to the second heat transfer unit such that the third external contacts of the third die and the second external contacts of the second die are aligned with the second gap and in electrical contact.

7. A method of assembling a microfeature device assembly, comprising:

attaching a first heat transfer unit to an interposer substrate having terminals, the first heat transfer unit having a first portion and a second portion, wherein the second portion is out of mechanical contact with and spaced apart from the first portion by a first gap extending between the first and second portions, wherein at least a portion of the terminals are aligned with the first gap;

securing a first microelectronic die having integrated circuitry and first external contacts to the first heat transfer unit, wherein the first external contacts at a front side of the first die are aligned with the first gap and electrically coupled to at least a portion of the terminals on the interposer substrate;

attaching a second heat transfer unit to a back side of the first die, the second heat transfer unit having a third portion, a fourth portion, and a second gap between the third and fourth portions such that at least a portion of the second external contacts at the back side of the first die are aligned with the second gap; and securing a second microelectronic die having integrated circuitry and second external contacts to the second heat transfer unit in a stacked arrangement with the first die, wherein the second external contacts at a front side of the second die are aligned with the second gap and electrically coupled to at least a portion of the first external contacts at the back side of the first die, wherein the first and second microelectronic dies have the same planform shape when viewed in the stacking direction, and wherein the first heat transfer unit has a first thickness and the second heat transfer unit has a second thickness, and wherein the first thickness and the second thickness are equal to or greater than thicknesses of the individual first die and second die.

8. The method of claim 7 wherein:

securing the first heat transfer unit to the interposer substrate comprises coupling first and second portions to the front side of the interposer substrate such that a first base and a second base of the first and second portions, respectively, are generally planar and a first and a second fin of the first and second portions, respectively, extend generally normal to the first and second bases; and attaching the second heat transfer unit to the back side of the first die comprises coupling the third and fourth regions to the back side of the die such that a third base and a fourth base of the third and fourth portions, respectively, are generally planar and a third and a fourth fin of the third and fourth portions, respectively, extend generally normal to the third and fourth bases.

9. The method of claim 7 wherein:

securing the first die to the first heat transfer unit comprises using an adhesive to attach the first heat transfer unit to a front side of the first die;

attaching the second heat transfer unit to the back side of the first die comprises attaching the second heat transfer unit using an adhesive; and securing the second die to the second heat transfer unit comprises using an adhesive to attach the second heat transfer unit to a back side of the second die.

10. A method of assembling a microfeature device assembly, comprising:

attaching a first microelectronic die to an interposer substrate having terminals, the first die having a first perimeter and including first external contacts electrically coupled to corresponding terminals;

stacking a second microelectronic die having second external contacts on the first die such that the second external contacts at a front side of the second die are electrically coupled to first external contacts at a back side of the first die, wherein the second microelectronic die has a second perimeter the same as the first perimeter when viewed in the stacking direction; and positioning a heat transfer unit between the first and second dies, wherein the heat transfer unit is composed of a silicon material having a higher thermal conductivity than silicon of the first and second microelectronic dies, wherein the heat transfer unit includes a first portion and a second portion, and wherein the second portion is out of mechanical contact with and spaced apart from the first portion by a gap extending between the first and second portions such that the first external contacts of the first die and second external contacts of the second die are aligned with the gap.

11. The method of claim 10 wherein the heat transfer unit is composed of Silicon-28 (Si-28).

* * * * *